United States Patent
Kwan et al.

(10) Patent No.: US 7,270,867 B1
(45) Date of Patent: Sep. 18, 2007

(54) LEADLESS PLASTIC CHIP CARRIER

(75) Inventors: Kin Pui Kwan, Tsz Ching Estate Kowloon (HK); Wing Him Lau, Yuen Long (HK); Kwok Cheung Tsang, Fauling (HK); Chun Ho Fan, Shamtseng (HK); Neil McLellan, Danville, CA (US)

(73) Assignee: ASAT Ltd., Tsuen Wan, New Territories (HK)

( * ) Notice: Subject to any disclaimer, the term of this patent is extended or adjusted under 35 U.S.C. 154(b) by 240 days.

(21) Appl. No.: 11/022,130

(22) Filed: Dec. 22, 2004

Related U.S. Application Data (63) Continuation-in-part of application No. 09/802,678, filed on Mar. 9, 2001, now Pat. No. 6,933,594, which is a continuation-in-part of application No. 09/288,352, filed on Apr. 8, 1999, now Pat. No. 6,498,099, which is a continuation-in-part of application No. 09/905,803, filed on Jun. 10, 1998, now Pat. No. 6,229,200.

(51) Int. Cl.
*H01L 21/48* (2006.01)

(52) U.S. Cl. .............. 428/111; 438/112; 257/E23.061

(58) Field of Classification Search ............... 438/111, 438/112, 123, 124, 611, 612; 257/E23.02, 257/E23.034, 23.035, E23.037, E23.054, 257/E23.061, E23.039

See application file for complete search history.

(56) References Cited

U.S. PATENT DOCUMENTS

| | | | |
|---|---|---|---|
| 4,530,152 A | 7/1985 | Roche et al. | |
| 4,685,998 A | 8/1987 | Quinn et al. | |
| 4,812,896 A | 3/1989 | Rothgery et al. | |
| 5,066,831 A | 11/1991 | Spielberger et al. | |
| 5,157,480 A | 10/1992 | McShane et al. | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,221,642 A | 6/1993 | Burns | |
| 5,273,938 A | 12/1993 | Lin et al. | |
| 5,277,972 A | 1/1994 | Sakumoto et al. | |
| 5,279,029 A | 1/1994 | Burns | |
| 5,293,072 A | 3/1994 | Tsuji et al. | |

(Continued)

FOREIGN PATENT DOCUMENTS

JP 59-208756 11/1984

*Primary Examiner*—Minh-Loan Tran
(74) *Attorney, Agent, or Firm*—Morrison & Foerster LLP (57) ABSTRACT

A process for fabricating a leadless plastic chip carrier includes selectively depositing a plurality of base layers on a first surface of a base of a leadframe strip to at least partially define a die attach pad and at least one row of contact pads. At least one further layer is selectively deposited on portions of the plurality of layers to further define at least the contact pads. The leadframe strip is then treated with a surface preparation. A semiconductor die is mounted to the die attach pad, followed by wire bonding the semiconductor die to at least the contact pads. Molding the semiconductor die, the wire bonds, the die attach pad and the contact pads on the surface of the leadframe strip, in a molding compound follows. The leadframe strip is etched to expose the contact pads and the die attach pad and the leadless plastic chip carrier is singulated from a remainder of the leadframe strip.

11 Claims, 6 Drawing Sheets

U.S. PATENT DOCUMENTS

| | | |
|---|---|---|
| 5,332,864 A | 7/1994 | Liang et al. |
| 5,343,076 A | 8/1994 | Katayama et al. |
| 5,406,124 A | 4/1995 | Morita et al. |
| 5,424,576 A | 6/1995 | Djennas et al. |
| 5,444,301 A | 8/1995 | Song et al. |
| 5,457,340 A | 10/1995 | Templeton, Jr. et al. |
| 5,474,958 A | 12/1995 | Djennas et al. |
| 5,483,099 A | 1/1996 | Natarajan et al. |
| 5,604,376 A | 2/1997 | Hamburgen et al. |
| 5,608,267 A | 3/1997 | Mahulikar et al. |
| 5,639,990 A | 6/1997 | Nishihara et al. |
| 5,640,047 A | 6/1997 | Nakashima et al. |
| 5,641,997 A | 6/1997 | Ohta et al. |
| 5,646,831 A | 7/1997 | Manteghi |
| 5,650,663 A | 7/1997 | Parthasarathi |
| 5,683,806 A | 11/1997 | Sakumoto et al. |
| 5,696,666 A | 12/1997 | Miles et al. |
| 5,701,034 A | 12/1997 | Marrs |
| 5,710,064 A | 1/1998 | Song et al. |
| 5,710,695 A | 1/1998 | Manteghi |
| 5,777,382 A | 7/1998 | Abbott et al. |
| 5,894,108 A | 4/1999 | Mostafazadeh et al. |
| 5,900,676 A | 5/1999 | Kweon et al. |
| 5,976,912 A | 11/1999 | Fukutomi et al. |
| 6,001,671 A | 12/1999 | Fjelstad |
| 6,057,601 A | 5/2000 | Lau et al. |
| 6,081,029 A | 6/2000 | Yamaguchi |
| 6,093,584 A | 7/2000 | Fjelstad |
| 6,124,637 A | 9/2000 | Freyman et al. |
| 6,194,786 B1 | 2/2001 | Orcutt |
| 6,229,200 B1 | 5/2001 | Mclellan et al. |
| 6,238,952 B1 | 5/2001 | Lin |
| 6,294,830 B1 | 9/2001 | Fjelstad |
| 6,306,685 B1 | 10/2001 | Liu et al. |
| 6,459,163 B1 | 10/2002 | Bai |
| 6,489,557 B2 | 12/2002 | Eskildsen et al. |
| 6,498,099 B1 | 12/2002 | McLellan et al. |
| 6,528,877 B2 | 3/2003 | Ernst et al. |
| 6,585,905 B1 | 7/2003 | Fan et al. |
| 6,586,677 B2 | 7/2003 | Glenn |
| 6,635,957 B2 | 10/2003 | Kwan et al. |
| 6,762,118 B2 | 7/2004 | Liu et al. |
| 6,821,821 B2 | 11/2004 | Fjelstad |
| 6,872,661 B1 * | 3/2005 | Kwan et al. ............... 438/689 |
| 6,964,918 B1 * | 11/2005 | Fan et al. .................. 438/614 |
| 6,989,294 B1 * | 1/2006 | McLellan et al. .......... 438/111 |
| 2003/0015780 A1 | 1/2003 | Kang et al. |

* cited by examiner

LEADLESS PLASTIC CHIP CARRIER

CROSS-REFERENCE TO RELATED APPLICATIONS

This is a continuation-in-part of U.S. patent application Ser. No. 09/802,678, filed Mar. 9, 2001, now U.S. Pat. No. 6,933,594 which is a continuation-in-part of U.S. patent application Ser. No. 09/288,352, filed Apr. 6, 1999, now U.S. Pat. No. 6,498,099, issued Dec. 24, 2002, which is a continuation-in-part of U.S. patent application Ser. No. 09/095,803, filed Jun. 10, 1998, now U.S. Pat. No. 6,229,200, issued May 8, 2001.

FIELD OF THE INVENTION

The present invention relates in general to integrated circuit packaging, and more particularly to an improved process for fabricating a leadless plastic chip carrier that includes a post mold etch and unique contact pad and die attach pad features.

BACKGROUND OF THE INVENTION

According to well known prior art IC (integrated circuit) packaging methodologies, semiconductor dice are singulated and mounted using epoxy or other conventional means onto respective die pads (attach paddles) of a leadframe strip. Traditional QFP (Quad Flat Pack) packages incorporate inner leads which function as lands for wire bonding the semiconductor die bond pads. These inner leads typically require mold locking features to ensure proper positioning of the leadframe strip during subsequent molding to encapsulate the package. The inner leads terminate in outer leads that are bent down to contact a mother board, thereby limiting the packaging density of such prior art devices.

In order to overcome these and other disadvantages of the prior art, the Applicants previously developed a Leadless Plastic Chip Carrier (LPCC). According to Applicants' LPCC methodology, a leadframe strip is provided for supporting up to several hundred devices. Singulated IC dice are placed on the strip die attach pads using conventional die mount and epoxy techniques. After curing of the epoxy, the dice are gold wire bonded to peripheral internal leads. The leadframe strip is then molded in plastic or resin using a modified mold wherein the bottom cavity is a flat plate. In the resulting molded package, the die pad and leadframe inner leads are exposed. By exposing the bottom of the die attach pad, mold delamination at the bottom of the die paddle is eliminated, thereby increasing the moisture sensitivity performance. Also, thermal performance of the IC package is improved by providing a direct thermal path from the exposed die attach pad to the motherboard. By exposing the leadframe inner leads, the requirement for mold locking features is eliminated and no external lead standoff is necessary, thereby increasing device density and reducing package thickness over prior art methodologies. The exposed inner leadframe leads function as solder pads for motherboard assembly such that less gold wire bonding is required as compared to prior art methodologies, thereby improving electrical performance in terms of board level parasitics and enhancing package design flexibility over prior art packages (i.e. custom trim tools and form tools are not required). These and several other advantages of Applicants' own prior art LPCC process are discussed in Applicants' U.S. Pat. No. 6,229,200, the entire contents of which are incorporated herein by reference.

Applicants' LPCC production methodology utilizes saw singulation to isolate the perimeter I/O row as well as multi-row partial lead isolation. Specifically, the leadframe strip is mounted to a wafer saw ring using adhesive tape and saw-singulated using a conventional wafer saw. The singulation is guided by a pattern of fiducial marks on the bottom side of the leadframe strip. Also, special mold processing techniques are used to prevent the mold flow from bleeding onto the functional pad area and inhibiting electrical contact. Specifically, the exposed die pad surface is required to be deflashed after molding to remove any molding compound residue and thereby allow the exposed leads and die attach pad to serve as solder pads for attachment to the motherboard.

According to Applicants' U.S. Pat. No. 6,498,099, the entire contents of which are incorporated herein by reference, an etch back process is provided for the improved manufacture of the LPCC IC package. The leadframe strip is first subjected to a partial etch on one or both of the top and bottom surfaces in order to create a pattern of contact leads (pads) and a die attach pad (paddle). After wire bonding the contacts to a singulated semiconductor die, followed by overmolding and curing of the mold, the leadframe strip is exposed to a second full etch immersion for exposing the contact pads in an array pattern (i.e. multi-row) or perimeter pattern (i.e. single row), as well as the die attach pad. In the case of a package with multi-row I/O leads, this etch back step eliminates the requirement for two additional saw singulation operations (i.e. to sever the inner leads from the outer leads), and in both the single-row and multi-row configurations, the etch back step eliminates post mold processing steps (e.g. mold deflashing) and ensures superior device yield over the processing technique set forth in Applicants' prior application Ser. No. 09/095,803, now U.S. Pat. No. 6,229,200. Additionally, using this technique allows for higher I/O pad density and also allows for pad standoff from the package bottom which reduces stress in the solder joint during PCB temp cycling. Further, the technique allows for the use of a pre-singulation strip testing technique given that the electrical I/O pads are now isolated from each other and testing in strip can take place. This feature greatly increased the handling and throughput of the test operation.

Other prior art references teach the concepts of etching back a sacrificial substrate layer to expose contact pads and die attach paddle, such as U.S. Pat. Nos. 4,530,152 (Roche et al); 5,976,912 (Fukutomi, et al); 6,001,671 (Fjelstad) and Japanese patent application no. 59-208756 (Akiyama).

Still further improvements in integrated circuit packaging are driven by industry demands for increased thermal, mechanical and electrical performance.

SUMMARY OF THE INVENTION

In accordance with one aspect of the present invention, there is provided a process for fabricating a leadless plastic chip carrier. The process includes selectively depositing a plurality of base layers on a first surface of a base of a leadframe strip to at least partially define a die attach pad and at least one row of contact pads. At least one further layer is selectively deposited on portions of the plurality of layers to further define at least the contact pads. The leadframe strip is then treated with a surface preparation. A semiconductor die is mounted to the die attach pad, followed by wire bonding the semiconductor die to at least the contact pads. Molding the semiconductor die, the wire bonds, the die attach pad and the contact pads on the surface of the leadframe strip, in a molding compound follows. The leadframe strip is etched to expose the contact pads and the die attach pad and the leadless plastic chip carrier is singulated from a remainder of the leadframe strip.

In accordance with another aspect of the present invention, there is provided a process for fabricating a leadframe strip for use in fabricating an integrated circuit package. The process includes selectively depositing a plurality of base layers on a first surface of a base of the leadframe strip to at least partially define a die attach pad and at least one row of contact pads. At least one further layer is selectively deposited on portions of the plurality of layers to further define at least the contact pads and the leadframe strip is treated with a surface preparation.

Advantageously, the leadframe strip is treated with a surface preparation after depositing the base layers and the at least one further layer, to inhibit oxidation of copper in the base layers and to promote bonding to organic mold compound that is added later in the process.

DETAILED DESCRIPTION OF THE PREFERRED EMBODIMENTS

In Applicant's co-pending U.S. patent application Ser. No. 09/802,678, filed Mar. 9, 2001, the entire contents of which are incorporated herein by reference, a build-up process of depositing layers of metal to form a die attach pad and contact pads is provided. After die attach, wire bond and encapsulation in a molding material, the leadframe is subjected to an alkaline etch to expose the contact pads and die attach pad. The present invention relates to an improvement over applicant's U.S. patent application Ser. No. 09/802,678. Wherever possible, the same reference numerals have been used in this application to denote identical features described in Applicant's U.S. patent application Ser. No. 09/802,678.

Figure 1A:
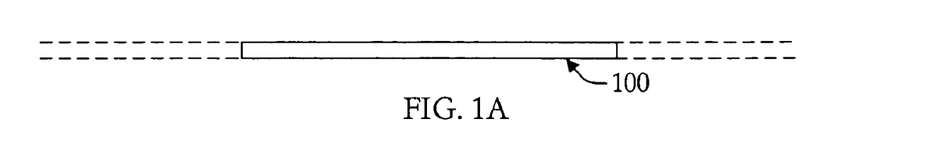
FIGS. 1A to 1K show processing steps for fabricating a leadless plastic chip carrier according to one embodiment of the present invention.

Referring to FIG. 1A, an elevation view is provided of a Cu (copper) panel substrate which forms the base of the leadframe strip indicated generally by the numeral 100. As discussed in greater detail in Applicants' own U.S. Pat. No. 6,229,200 the leadframe strip 100 is divided into a plurality of sections, each of which incorporates a plurality of leadframe units in an array (e.g. 3×3 array, 5×5 array, etc.). Only one such unit is depicted in the elevation view of FIG. 1A, portions of adjacent units being shown by stippled lines. For the purpose of simplicity, the fabrication of a single unit is described below. It will be appreciated, however, that the LPCC packages are gang fabricated in the process described below.

Figure 1B:
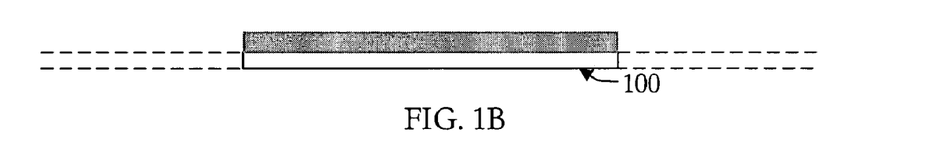

Referring to FIG. 1B, an upper surface of the base of the leadframe strip 100 is coated with a layer of photo-imageable etch resist such as a photo-imageable epoxy.

Figure 1C:
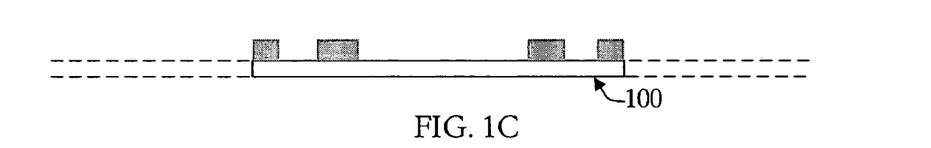

Next, the layer of photo-imageable solder mask is imaged with a photo-tool. This is accomplished by exposure of the photo-imageable solder mask to ultraviolet light masked by the photo-tool and subsequent developing, resulting in the solder-mask shown in FIG. 1C. The solder mask is thereby patterned to provide pits in which an upper surface of the Cu substrate is exposed.

Figure 1D:
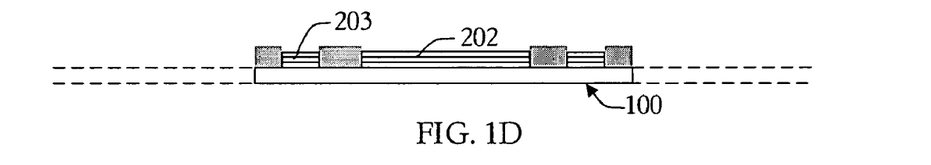

Referring to FIG. 1D, a plurality of base layers of metals are deposited on the upper surface of the exposed copper substrate to form at least portions of a die attach pad 202 and a plurality of contact pads 203 that circumscribe the die attach pad 202. In the present embodiment, three layers of metal are plated on the copper leadframe strip 100, in the pits in the solder mask. The layers of metal include an etch barrier layer of gold (Au) (for example, 20 microinches), followed by a layer of nickel (Ni) (for example, 40 microinches), followed by a layer of copper (Cu) (for example, 3 to 4 mils).

Other plating options are available including for example, the deposition of a layer of flash copper (Cu) (for example, 50 microinches), on the copper leadframe strip 100, prior to deposition of the base layers of metal. The flash copper is provided over the Cu substrate for creating an etch down cavity following post mold etching, as will be described below.

Still other plating options include the deposition of an etch barrier of tin (Sn) (for example, 100-300 microinches) rather than the deposition of Au and Ni on the copper leadframe strip 100. The etch barrier of Sn is followed by a layer of Cu (for example, 3 to 4 mils).

Figure 1E:
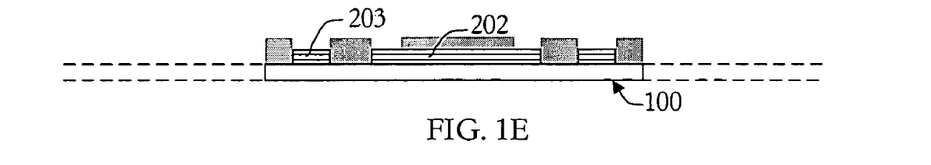

After deposition of the base layers of metal, a further photo-imageable plating mask is deposited and imaged with a photo-tool to provide a mask on the die attach pad 202, in the centre of the package, as shown in FIG. 1E.

Figure 1F:
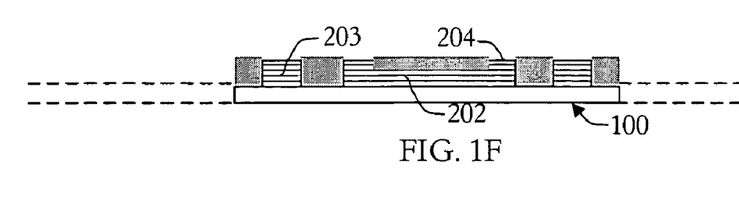

Referring now to FIG. 1F, final layers of nickel (Ni) (for example, 40 microinches) and gold (Au) (for example, 20 microinches) are deposited on the exposed copper of the contact pads 203 to complete the contact pads 203, and around the periphery of the die attach pad 202 to thereby define a ground ring 204.

Other final layer plating options are available, including for example, a final layer of silver (Ag) (for example, 100-300 microinches on the exposed copper of the contact pads 203 and around the periphery of the die attach pad 202 to thereby define a ground ring 204, rather than the deposition of Ni and Au.

The plating options described above result in successive layers of metal built up to form the contact pads 203 and the ground ring 204. It will be understood that the portion of the die attach pad 202 to which the semiconductor die is later added, includes only the base layers of metals as the die attach pad 202 is masked during the deposition of the final layers of metals.

Figure 1G:
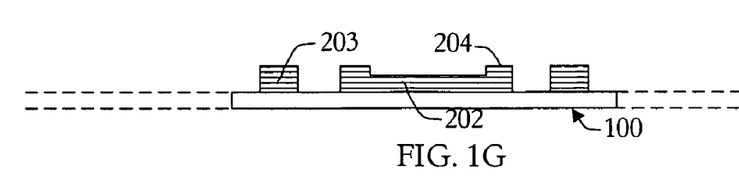

After plating, the photo-imageable solder mask is then stripped away using conventional techniques and the leadframe strip 100 including the built-up layers of metal is cleaned resulting the die attach pad 202, the contact pads 203 and the ground ring 204, as shown in FIG. 1G. Clearly, the layer of plated Cu is exposed on the top surface of the die attach pad 202, on the sides of the contact pads 203 and on the sides of the die attach pad 202, under the ground ring 204. The copper of the base of the leadframe strip 100 is also exposed between the contact pads 203 and between the die attach pad 202 and the contact pads 203.

Figure 1H:
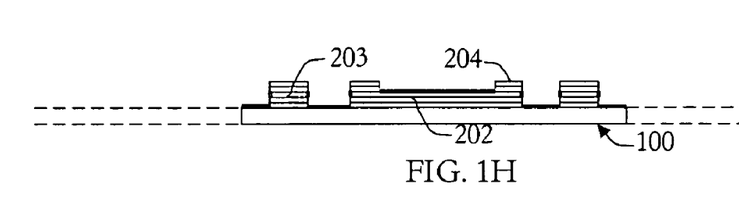

The leadframe including the built-up layers of metal, is then treated by dipping in a surface preparation to prepare the surface of the copper to inhibit copper oxidation and promote bonding to molding compound that is added later during molding. A suitable surface preparation includes, for example, an organic black oxide. The surface preparation reacts with copper to form an organo-metallic compound that inhibits further oxidation of the base copper and aids in adhesion of the copper with the molding compound and die attach epoxy that is added later. One such suitable surface preparation includes a mixture of hydrogen peroxide and benzotriazole, in the range of about 30% to about 40% by weight of hydrogen peroxide and from about 1% to about 5% by weight benzotriazole with the remainder being water, for example. In the present embodiment, the surface preparation is held at a temperature in the range of about 30° C. to about 40° C. during treatment of the leadframe.

Figure 1I:
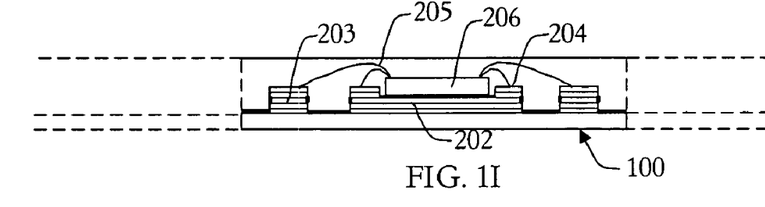

Referring now to FIG. 1I, a singulated semiconductor die 206 is conventionally mounted via suitable mounting means, such as epoxy, to the die attach pad 202, and the epoxy is cured. Gold wires 205 are then bonded between the semiconductor die 206 and the contact pads 203 and between the semiconductor die 206 and the ground ring 204. The leadframe 100 is then molded in molding compound using a modified mold with the bottom cavity being a flat plate, and subsequently cured, as discussed in Applicants' application Ser. No. 09/095,803. The leadframe 100 after the foregoing steps is shown in FIG. 1I, which includes the molding compound.

Figure 1J:
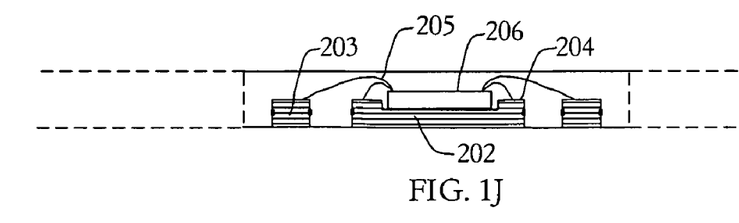

The leadframe 100 is then subjected to a final alkaline etching via full immersion to etch away the copper of the base of the leadframe strip, which exposes an array of exposed contact pads 203 and the die attach pad 202, as shown in FIG. 1J. Thus, the base of the leadframe strip is etched away, leaving the LPCC packages in a molded strip.

For the plating options described above in which the layer of flash copper (Cu) is first deposited on the leadframe strip 100, the flash Cu is also etch away to leave etch down cavities at the contact pads 203 and the die attach pad 202. In this case, the cavities are used for attachment of solder balls to the contact pads 203.

Figure 1K:
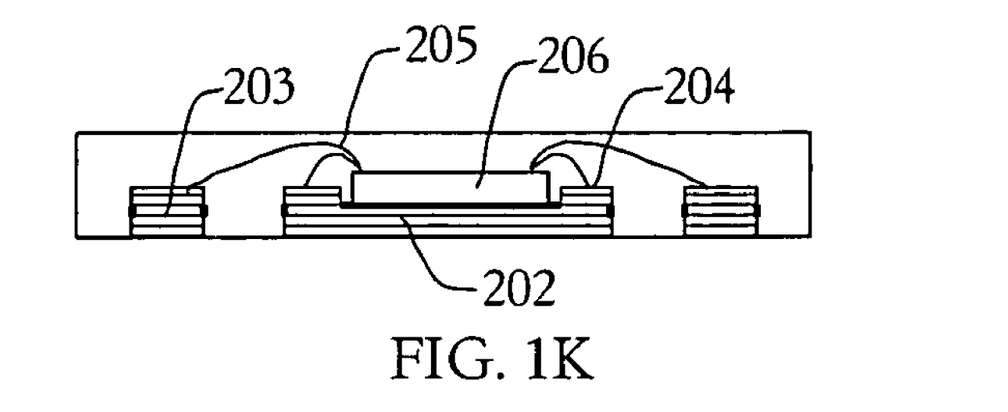

Singulation of the individual units from the molded strip is then performed by suitable means such as saw singulation or die punching, resulting in the final configuration of FIG. 1K.

Referring now to FIGS. 2A to 2K, the processing steps for manufacturing a LPCC, are shown, in accordance with another embodiment of the invention. It will be appreciated that many of the manufacturing steps of the present embodiment are similar to those described in FIGS. 1A to 1K.

Figure 2A:
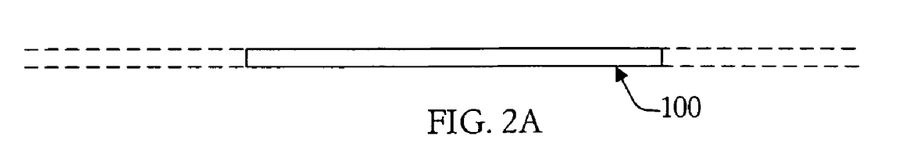
FIGS. 2A to 2K show process steps for fabricating a leadless plastic chip carrier according to another embodiment of the present invention.

Referring to FIG. 2A, an elevation view is provided of a Cu (copper) panel substrate which forms the base of the leadframe strip indicated generally by the numeral 100.

Figure 2B:
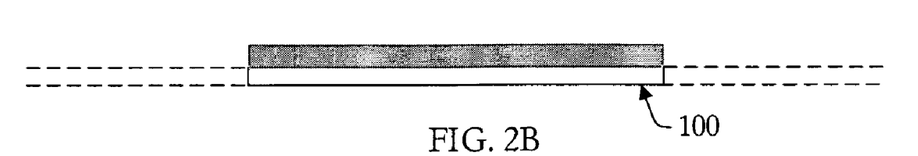

As in FIG. 1B, an upper surface of the base of the leadframe strip 100 is coated with a layer of photo-imageable etch resist such as a photo-imageable epoxy in FIG. 2B.

Figure 2C:
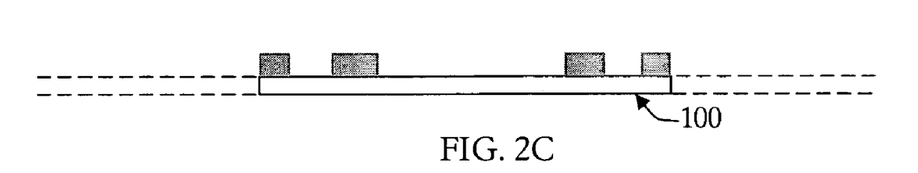

Next, the layer of photo-imageable solder mask is imaged with a photo-tool. This is accomplished by exposure of the photo-imageable solder mask to ultraviolet light masked by the photo-tool and subsequent developing of the solder-mask, as shown in FIG. 2C. The solder mask is thereby patterned to provide pits in which an upper surface of the Cu substrate is exposed.

Figure 2D:
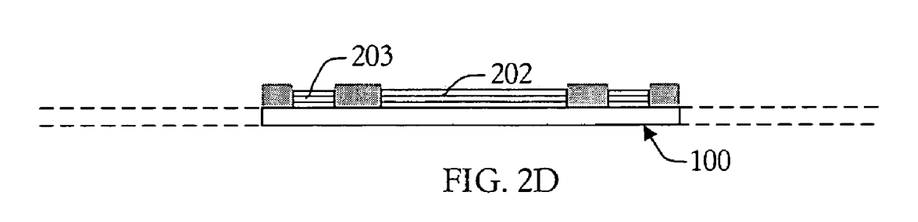

Referring to FIG. 2D, base layers of metals are deposited on the upper surface of the exposed copper substrate to form at least portions of a die attach pad 202 and a plurality of contact pads 203. The plating options in the present embodiment are similar to those of the first-described embodiment.

Figure 2E:
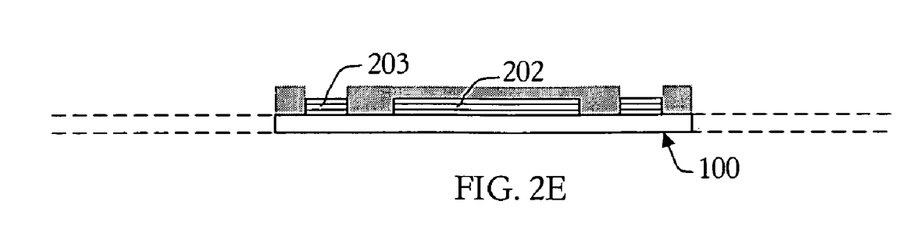

After deposition of the base layers of metal, a further photo-imageable plating mask is deposited and imaged with a photo-tool to provide a mask on the die attach pad 202, in the centre of the package, as shown in FIG. 2E. In the present embodiment, the further photo-imageable plating mask covers the entire upper surface of the die attach pad 202.

Figure 2F:
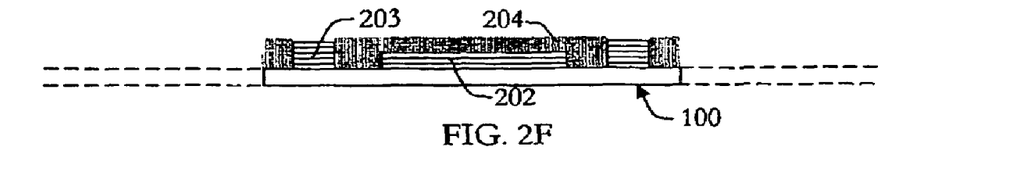

Referring now to FIG. 2F, final layers of metals such as nickel (Ni) (for example, 40 microinches) and gold (Au) (for example, 20 microinches) are deposited on the exposed copper of the contact pads 203. It will be appreciated that the final layers of metals are not deposited around the periphery of the die attach pad 202 and thus, no ground ring is provided on the die attach pad 202. As in the first-described embodiment, plating options for the final layers of metals are available.

Figure 2G:
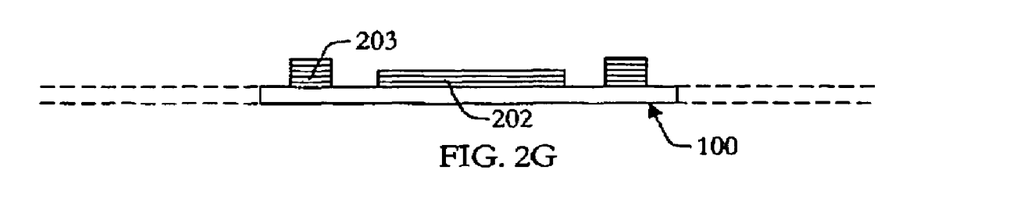

After the photo-imageable solder mask is then stripped away using conventional techniques and the leadframe strip 100 including the built-up layers of metal is cleaned resulting in the die attach pad 202 and the contact pads 203, as shown in FIG. 2G. Clearly, the layer of plated Cu is exposed on the die attach pad 202 and on the sides of the contact pads 203. The copper leadframe strip 100 is also exposed between the contact pads 203 and between the die attach pad 202 and the contact pads 203.

Figure 2H:
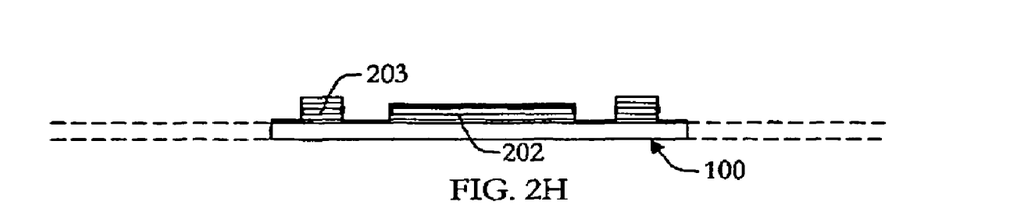

As in the first-described embodiment, the leadframe including the built-up layers of metal, is then dipped in a surface preparation to prepare the surface of the copper to inhibit copper oxidation and promote bonding to molding compound that is added later during molding. A suitable surface preparation includes, for example, an organic black oxide (FIG. 2H).

Figure 2I:
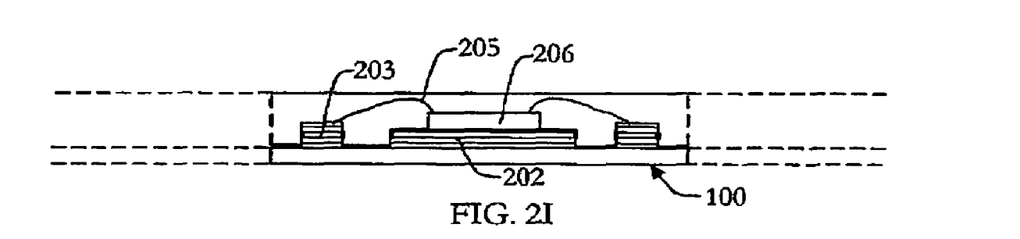

Referring now to FIG. 2I, a singulated semiconductor die 206 is conventionally mounted via suitable mounting means, such as epoxy, to the die attach pad 202, and the epoxy is cured. Gold wires 205 are then bonded between the semiconductor die 206 and the contact pads 203 and the leadframe 100 is molded in molding compound using a modified mold with the bottom cavity being a flat plate, followed by curing, as discussed in Applicants' application Ser. No. 09/095,803. The leadframe 100 after the foregoing steps is shown in FIG. 2I, which includes the molding compound.

Figure 2J:
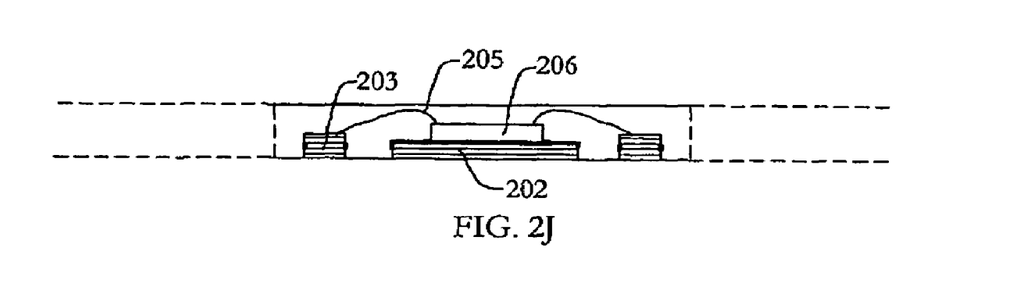

The leadframe 100 is then subjected to a final alkaline etching via full immersion to etch away the copper of the base of the leadframe strip 100 which exposes an array of exposed contact pads 203 and the die attach pad 202, as shown in FIG. 2J. Thus, the copper of the base of the leadframe strip 100 is etched away, leaving the LPCC packages in a molded strip.

Figure 2K:
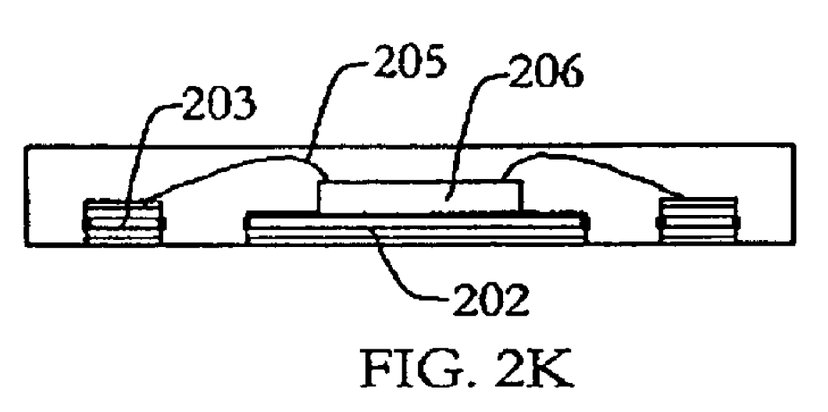

Singulation of the individual units from the molded strip is then performed by suitable means such as saw singulation or die punching, resulting in the final configuration of FIG. 2K.

Specific embodiments of the present invention have been shown and described herein. Modifications and variations to these embodiments may occur to those skilled in the art. All such modifications and variations are believed to be within the sphere and scope of the present invention.

What is claimed is:

1. A prossess for fabricating a leadless plastic chip carrier, the process comprising:
   selectively depositing a plurality of base layers on a first surface of a base of a leadframe strip to at least partially define a die attach pad and at least one row of contact pads; wherein selectively depositing said plurality of base layers comprises,
      depositing a photo-imageable mask on said first surface of said leadframe strip;
      imaging and developing said mask to define a plurality of pits in which said first surface is exposed; and
   depositing successive layers of metal in said pits
   selectively depositing at least one further layer on portions of said plurality of layers to further define at least said contact pads, wherein selectively depositing said at least one further layer comprises:

depositing a further photo-imageable mask on an outer surface of said base layers of metal;
imaging and developing said further photo-imageable mask to expose said contact pads;
depositing at least one further layer of metal on said contact pads; and
stripping said photo-imageable mask and said further photo-imageable mask;
treating said leadframe strip with a surface preparation;
mounting a semiconductor die to said die attach pad;
wire bonding said semiconductor die to at ones of the contact pads;
molding said semiconductor die, said wire bonds, said die attach pad and said contact pads on said surface of said leadframe strip, in a molding compound;
etching said base of said leadframe strip to expose said contact pads and said die attach pad;
singulating said leadless plastic chip carrier from a remainder of said leadframe strip.

2. The process according to claim 1, wherein selectively depositing a plurality of base layers includes selectively depositing at least one layer of copper, and wherein said treating comprises dipping in a surface preparation to inhibit copper oxidation and promote bonding of copper to said molding compound.

3. The process according to claim 2, wherein said treating comprises dipping in a surface preparation that reacts with copper to form an organo-metallic compound.

4. The process according to claim 1, wherein selectively depositing a plurality of base layers includes selectively depositing at least one layer of copper, and wherein said treating comprises dipping in organic black oxide to inhibit copper oxidation.

5. The process according to claim 1, wherein selectively depositing said at least one further layer comprises:
depositing a further photo-imageable mask on an outer surface of said base layers of metal;
imaging and developing said further photo-imageable mask to expose said contact pads and a peripheral portion of said die attach pad;
depositing at least one further layer of metal on said contact pads and on said peripheral portion of said die attach pad to define a ground ring; and
stripping said photo-imageable mask and said further photo-imageable mask.

6. The process according to claim 1, wherein said wire bonding further comprises wire bonding said semiconductor die to said ground ring.

7. A process for fabricating a leadframe strip for use in fabricating an integrated circuit package, the process comprising:
selectively depositing a plurality of base layers on a first surface of a base of said leadframe strip to at least partially define a die attach pad and at least one row of contact pads, wherein said selectively depositing said plurality of base layers comprises:
depositing a photo-imageable mask on said first surface of said leadframe strip;
imaging and developing said mask to define a plurality of pits in which said first surface is exposed; and
depositing successive layers of metal in said pits;
selectively depositing at least one further layer on portions of said plurality of layers to further define at least said contact pads, wherein selectively depositing said at least one further layer comprises:
depositing a further photo-imageable mask on an outer surface of said base layers of metal;
imaging and developing said further photo-imageable mask to expose said contact pads;
depositing at least one further layer of metal on said contact pads; and
stripping said photo-imageable mask and said further photo-imageable mask; and
treating said leadframe strip with a surface preparation.

8. The process according to claim 7, wherein selectively depositing a plurality of base layers includes selectively depositing at least one layer of copper, and wherein said treating comprises dipping in a surface preparation to inhibit copper oxidation and promote bonding of copper to said molding compound.

9. The process according to claim 8, wherein said treating comprises dipping in a surface preparation that reacts with copper to form an organo-metallic compound.

10. The process according to claim 7, wherein selectively depositing a plurality of base layers includes selectively depositing at least one layer of copper, and wherein said treating comprises dipping in organic black oxide to inhibit copper oxidation.

11. A process for fabricating a leadframe strip for use in fabricating an integrated circuit package, the process comprising:
selectively depositing a plurality of base layers on a first surface of a base of said leadframe strip to at least partially define a die attach pad and at least one row of contact pads, wherein said selectively depositing said plurality of base layers comprises:
depositing a photo-imageable mask on said first surface of said leadframe strip;
imaging and developing said mask to define a plurality of pits in which said first surface is exposed; and
depositing successive layers of metal in said pits;
selectively depositing at least one further layer on portions of said plurality of layers to further define at least said contact pads;
wherein selectively depositing said at least one further layer comprises:
depositing a further photo-imageable mask on an outer surface of said base layers of metal;
imaging and developing said further photo-imageable mask to expose said contact pads and a peripheral portion of said die attach pad;
depositing at least one further layer of metal on said contact pads and on said peripheral portion of said die attach pad to define a ground ring; and
stripping said photo-imageable mask and said further photo-imageable mask.

* * * * *